(12) United States Patent
Hausmann et al.

(10) Patent No.: US 8,659,455 B2
(45) Date of Patent: Feb. 25, 2014

(54) SYSTEM AND METHOD FOR OPERATING AN ANALOG TO DIGITAL CONVERTER

(75) Inventors: Michael Hausmann, Gleisdorf (AT); Heimo Hartlieb, Graz (AT)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 13/483,988

(22) Filed: May 30, 2012

(65) Prior Publication Data
US 2013/0321188 A1 Dec. 5, 2013

(51) Int. Cl.
*H03M 1/06* (2006.01)

(52) U.S. Cl.
USPC ............ 341/118; 341/119; 341/143; 341/155

(58) Field of Classification Search
USPC .......................... 341/118, 119, 120, 143, 155
See application file for complete search history.

(56) References Cited

U.S. PATENT DOCUMENTS

| | | | | |
|---|---|---|---|---|
| 5,157,395 A | * | 10/1992 | Del Signore et al. | 341/143 |
| 5,838,272 A | * | 11/1998 | Steiner et al. | 341/143 |
| 5,936,561 A | * | 8/1999 | Lee | 341/143 |
| 6,218,972 B1 | * | 4/2001 | Groshong | 341/143 |
| 6,788,233 B1 | * | 9/2004 | Quiquempoix et al. | 341/143 |
| 6,965,339 B2 | * | 11/2005 | Midya et al. | 341/163 |
| 7,812,750 B2 | * | 10/2010 | Lakdawala et al. | 341/143 |
| 7,961,129 B2 | * | 6/2011 | Ceballos et al. | 341/143 |
| 2003/0067404 A1 | * | 4/2003 | Ruha et al. | 341/143 |
| 2007/0176819 A1 | * | 8/2007 | May | 341/155 |
| 2010/0079324 A1 | * | 4/2010 | Lakdawala et al. | 341/143 |

* cited by examiner

*Primary Examiner* — Linh Nguyen
(74) *Attorney, Agent, or Firm* — Slater & Matsil, L.L.P.

(57) ABSTRACT

A system and method can be used for scaling an output of a modulator of a sigma-delta analog to digital converter and systems and a method can be used for compensating temperature-dependent variations of a reference voltage in a sigma-delta analog to digital converter. In accordance with one embodiment, a system can be used for scaling an output of a modulator of a sigma-delta analog digital converter (ADC). A decimation filter has a decimation length that is adjustable by a decimation length value received as an input to the decimation filter. The decimation filter is configured to receive the output of the modulator of the sigma-delta ADC and to decimate the received output of the modulator of the sigma-delta ADC using the received decimation length value.

23 Claims, 3 Drawing Sheets

SYSTEM AND METHOD FOR OPERATING AN ANALOG TO DIGITAL CONVERTER

TECHNICAL FIELD

The invention relates generally to a system and method for operating an analog to digital converter and, in particular embodiments, to a systems and methods for scaling an output of a modulator of a sigma-delta analog to digital converter and systems and methods for compensating temperature-dependent variations of a reference voltage in a sigma-delta analog to digital converter.

BACKGROUND

In many applications, such as in lithium ion battery management integrated circuits, for example, high precision voltage measurements are required which necessitate extremely small absolute errors (e.g., <1.5 mV).

These voltage measurements can be carried out using sigma delta analog digital converters (ADCs). Sigma delta ADCs output a bit stream which has a mean value corresponding to the mean value of the input signal, i.e., the "pulse-density," which is the number of "1" within a predefined total number of bits corresponds to the voltage value measured by the sigma delta ADC.

The output range of a sigma delta ADC (native ADC range) is defined by one or two reference voltages that are, however, not fixed, but may vary with temperature or other physical variables. Therefore, when measuring voltages by means of a sigma delta ADC, the range of the voltages to be measured (corrected result range) has to be smaller than the smallest ("worst case") native ADC range.

For a transformation of the native range to the corrected result range, the output values are scaled and, if necessary, offset corrected. Due to varying (e.g., temperature dependent) reference voltages, it is desirable that the transformation is adaptively adjustable such that the transformation can be continuously adapted to varying reference voltages. Otherwise, the e.g., temperature stability requirements for the reference(s) would be very high or even not feasible dependent on the required measurement accuracy.

Conventional approaches for carrying out the transformation of the native range to the corrected result range use floating point calculations in a microcontroller to scale the output of a sigma delta ADC. Such a solution is very intricate on chip level and requires a semiconductor technology having high integration density of circuits. Further, when transferring the calculations required for scaling the sigma delta ADC output to a microcontroller, continuous adjustment of the scaling of the sigma delta ADC output to varying reference voltages (due to e.g., temperature changes) will be difficult.

Therefore, there e.g., exists a need for a method and/or system for scaling of sigma delta ADC outputs and/or compensating changes of reference voltages of sigma delta ADCs which require less complex circuitry and lower integration density of circuits.

SUMMARY OF THE INVENTION

In accordance with an aspect of the invention, a system can be used for scaling an output of a modulator of a sigma-delta analog digital converter (ADC) that comprises a decimation filter whose decimation length is adjustable by a decimation length value received as input by the decimation filter. The decimation filter is configured to receive the output of the modulator of the sigma-delta ADC and to decimate the received output of the modulator of the sigma-delta ADC using the received decimation length value.

In accordance with a further aspect of the invention, a method can be used for scaling an output of a modulator of a sigma-delta analog digital converter (ADC). A number of steps are carried out by a decimation filter having an adjustable decimation length. A decimation length value is received. The output of the modulator of a sigma-delta ADC is also received. The received output of the modulator of the sigma-delta ADC is decimated using the received decimation length value.

Further features, aspects and advantages of the present invention will become apparent from the following detailed description of the invention made with reference to the accompanying drawings.

BRIEF DESCRIPTION OF THE DRAWINGS

The accompanying drawings are included to provide a further understanding of the present invention and are incorporated in and constitute a part of this specification. The drawings illustrate embodiments of the present invention and together with the description serve to explain the principles of the invention. Other embodiments of the present invention and many of the intended advantages of the present invention will be readily appreciated as they become better understood by reference to the following detailed description.

DETAILED DESCRIPTION OF ILLUSTRATIVE EMBODIMENTS

In the following detailed description, reference is made to the accompanying drawings, which form a part thereof, and in which is shown by way of illustration specific embodiments in which the invention may be practiced. It is to be understood that other embodiments may be utilized and structural or other changes may be made without departing from the scope of the present invention. The following detailed description, therefore, is not to be taken in a limiting sense, and the scope of the present invention is defined by the appended claims.

In many applications, such as in lithium ion battery management integrated circuits, for example, high precision voltage measurements are required which necessitate extremely small absolute errors (e.g., <1.5 mV).

These voltage measurements can be carried out using sigma delta analog digital converters (ADCs). Sigma delta ADCs output a bit stream that has a mean value corresponding to the mean value of the input signal, i.e., the "pulse-density" or the number of "1" values within a predefined total number of bits corresponds to the voltage value measured by the sigma delta ADC.

The output range of a sigma delta ADC (native ADC range) is defined by one or two reference voltages that are, however, not fixed, but vary with temperature or other physical variables. Therefore, when measuring voltages by means of a sigma delta ADC, the range of the voltages to be measured (corrected result range) has to be smaller than the smallest ("worst case") native ADC range.

For a transformation of the native range to the corrected result range, the output values are scaled and, if necessary, offset corrected. Due to varying (e.g., temperature dependent) reference voltages, it is desirable that the transformation is adaptively adjustable such that the transformation can be continuously adapted to varying reference voltages. Otherwise, the e.g., temperature stability requirements for the reference(s) would be very high or even not feasible dependent on the required measurement precision.

Figure 1:
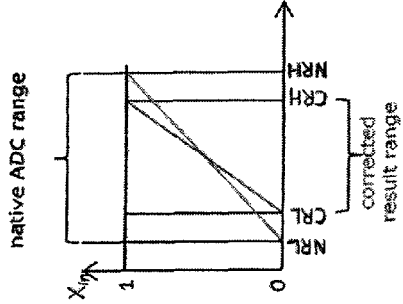
FIG. 1 shows a schematic diagram illustrating an exemplary transformation of ranges.

FIG. 1 shows a schematic diagram illustrating an exemplary transformation of ranges. The native ADC range, which is the output range of a sigma delta ADC and extends from the lower limit "NRL" to the upper limit "NRH," has a resolution of $2^L*a$ bits. The variable L is the bit width of the measurement result and the variable a is a number to be determined (see below). The corrected result range or predetermined result range, respectively, which extends from the lower limit "CRL" to the upper limit "CRH," has a resolution of $2^L$ bits.

The Y-coordinate of the diagram of FIG. 1 shows the pulse-density "$X_{in}$." $X_{in}$ is the number of "1" contained in the digital voltage value output by the sigma delta ADC divided by the total number of bits of the digital voltage value output by the sigma delta ADC. Thus, $X_{in}$ can reach values from 0 to 1 ($0 \leq X_{in} \leq 1$) within the native ADC range. However, $X_{in}$ does not reach the extremal values 0 and 1 within the corrected result range, which contains all possible voltage measurement values, in particular also the full-scale value. Thus, a transformation of the native ADC range to the corrected result range is required. The result to be achieved by the transformation is also shown in FIG. 1. After rescaling and offset correction, $X_{in}$ also reaches the extremal values 0 and 1 at the boundary of the corrected result range.

In conventional approaches, the pulse density $X_{in}$ is scaled for carrying out the transformation of the native range to the corrected result range by having a microcontroller perform floating point calculations for the scaling.

According to an embodiment of the invention, a decimation filter is used for scaling the sigma delta ADC measurement result. More precisely, the decimation length of the decimator is adjusted for scaling the sigma delta ADC measurement result. Thus, instead of scaling the pulse density $X_{in}$ directly as done in conventional approaches, the decimation length over which the pulse density $X_{in}$ is summated is adjusted to scale the sigma delta ADC measurement result according to an embodiment of the invention.

If, for example, the end result R should have a bit width L, which corresponds to a range of values from 0 to $2^L-1$, and a resolution of $2^L$, respectively, the decimation length N can be adjusted using the quotient of the length of the native ADC range (NRH-NRL) and the length of the corrected result range (CRH-CRL):

$$a=(NRH-NRL)/(CRH-CRL) \quad (1)$$

$$N=2^L*a \quad (2)$$

The result S of the decimation is given in equation (3):

$$S=X_{in}*N=X_{in}*2^L*a \quad (3)$$

It is to be appreciated that continuous adjustment of the decimation length is not critical as small changes of the decimation length only induce small changes of the measurement result. For example, a change of the decimation length by +/−1 changes the measurement result by only +/−1 least significant bit (LSB) at most as can be taken from equation (3a):

$$dS/dN=X_{in} \leq 1 \quad (3a)$$

Thus, reproducibility, differential nonlinearity (DNL) and accuracy of the measurement are not impaired.

If required, an offset correction may additionally be carried out by subtracting an offset correction value K from the decimation result S, wherein the offset correction value K is given by equation (4):

$$K=[(CRL-NRL)/(NRH-NRL)]*N=[(CRL-NRL)/(NRH-NRL)]*[(NRH-NRL)/(CRH-CRL)]*2^L = [(CRL-NRL)/(CRH-CRL)]*2^L \quad (4)$$

The end result R which is the offset corrected decimation result S is given by equation (5):

$$R=S-K=2^L*[X_{in}*a-(CRL-NRL)/(CRH-CRL)] \quad (5)$$

Figure 2:
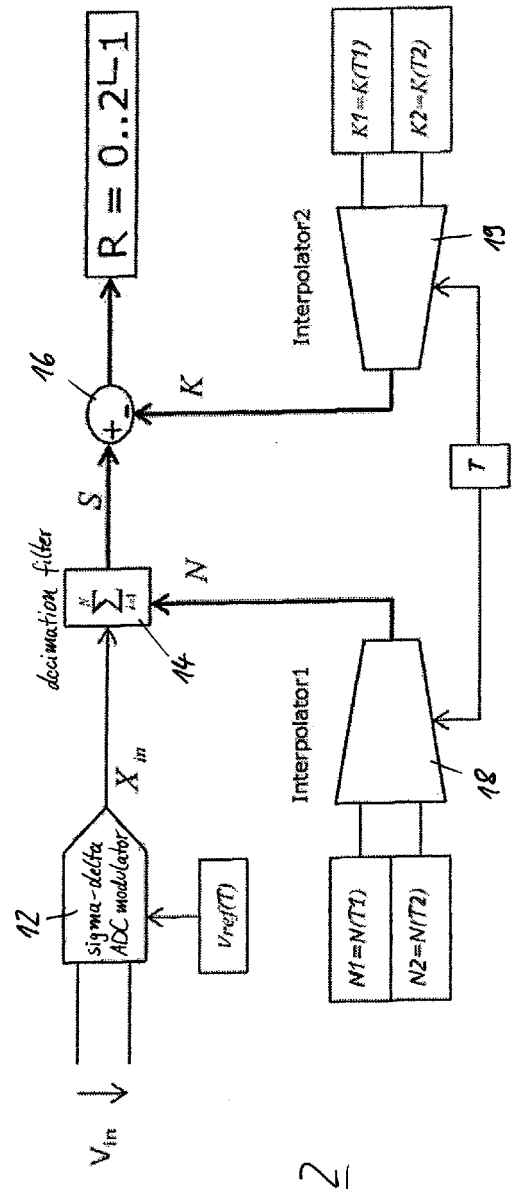
FIG. 2 exemplarily shows a simplified schematic diagram of a system according to an embodiment of the invention.

FIG. 2 exemplarily shows a simplified schematic diagram of a system according to an embodiment of the invention. The system comprises a sigma delta ADC modulator 12, a decimation filter 14, a subtracter 16, a first interpolator 18 and a second interpolator 19.

Sigma delta ADC modulator 12 receives an analog voltage signal $V_{in}$ and one or two voltage references (which are temperature dependent in this embodiment) and outputs a pulse-density $X_{in}$ that specifies a "density" of "1" contained within a predefined number of bits, i.e., the quotient of the number of "1" and the total number of bits.

Decimation filter 14 receives the pulse-density $X_{in}$ output by the sigma delta ADC modulator 12 and a value N that specifies the decimation length of the decimation filter 14, sums the received pulse-density $X_{in}$ over the decimation length N and outputs the decimation result S to the subtracter 16. Subtracter 16 subtracts an offset correction value K from the received decimation result and outputs the end result R.

In this embodiment of the invention, the decimation filter 14 is used for scaling the raw data output by the sigma delta ADC modulator 12, or, more precisely, an appropriate decimation length N is chosen for the decimation filter 14 to scale the output of the sigma delta ADC modulator 12. The appropriate decimation length N can be calculated using equations (1) and (2) as explained above.

According to a preferred embodiment of the invention, the decimation length N may adaptively be adjusted. Since the one or two reference voltages which determine the native ADC range are temperature dependent, the decimation length is advantageously calculated as a function of temperature (N=N(T)). This may be achieved by using, for example, two calibration temperatures T1 and T2 at which a first decimation length N1=N(T1) and a second decimation length N2=N(T2) are calculated using equations (1) and (2). The decimation length N(T) at a current temperature T may then be calculated by interpolation and/or extrapolation, in particular linear interpolation in this example.

The invention is, however, not limited to the use of linear interpolation, but quadratic interpolation or polynomial interpolation and/or linear/quadratic/polynomial extrapolation may, for example, also be used. It is to be appreciated that also more than two (e.g., 3 or 5) calibration temperatures may be used and more than two (e.g., 3 or 5) decimation lengths may be calculated for the more than two calibration temperatures to obtain more than two data points for the interpolation and/or extrapolation.

In this example, linear interpolation based on two data points (T1/N1) and (T2/N2) is performed. The decimation length N=N(T) at a current temperature T may then be calculated using equation (6):

$$N(T)=N1+[(N2-N1)/(T2-T1)]*(T-T1) \quad (6)$$

In the embodiment shown in FIG. 2, the first interpolator 18 receives the current temperature T, two calibration temperatures T1 and T2 and the corresponding decimation lengths N1 and N2. Based on the two data points (T1/N1) and (T2/N2), the interpolator 18 performs a linear interpolation in accordance with equation (6).

According to a further preferred embodiment of the invention, the decimation result may additionally be offset corrected if required. The offset correction value K and can be calculated using equation (4). Subtracter 16 receives the decimation result S and the offset correction value K and determines the end result R (i.e., the offset corrected decimation result) by subtracting the offset correction value K from the decimation result S in accordance with equation (5).

According to a further preferred embodiment of the invention, the offset correction value K may also adaptively be adjusted. Since the one or two reference voltages which determine the native ADC range are temperature dependent in this example, the offset correction value K is advantageously calculated as a function of temperature (K=K(T)). This may be achieved by using, for example, two calibration temperatures T1 and T2 at which a first offset correction value K1=K(T1) and a second offset correction value K2=K(T2) are calculated using equation (4). The offset correction value K(T) at a current temperature T may then be calculated by interpolation and/or extrapolation, in particular linear interpolation in this example.

The invention is, however, not limited to the use of linear interpolation, but quadratic interpolation or polynomial interpolation and/or linear/quadratic/polynomial extrapolation may, for example, also be used. It is to be appreciated that also more than two (e.g., 3 or 5) calibration temperatures may be used and more than two (e.g., 3 or 5) offset correction values may be calculated for the more than two calibration temperatures to obtain more than two data points for the interpolation and/or extrapolation.

In this example, linear interpolation based on two data points (T1/K1) and (T2/K2) is performed. The offset correction value K=K(T) at a current temperature T may then be calculated using equation (7):

$$K(T)=K1+[(K2-K1)/(T2-T1)]*(T-T1) \quad (7)$$

In the embodiment shown in FIG. 2, the second interpolator 19 receives the current temperature T and two calibration temperatures T1 and T2 and the corresponding offset correction values K1 and K2. Based on the two data points (T1/K1) and (T2/K2), the interpolator 18 performs a linear interpolation in accordance with equation (7).

Thus, according to preferred embodiments of the invention, temperature variations which cause variations of the reference voltages of the sigma delta ADC can conveniently be compensated by means of one or more simple interpolator(s). In contrast, conventional solutions for temperature compensation use analog circuits which require, however, large chip area and do not provide flexibility for further adjustments. In addition, the effect of mechanical stress on the reference (which provides the reference voltage for the sigma delta ADC) is very difficult to predict when using analog circuits for temperature compensation.

Embodiments of the invention also advantageously allow the calibration of the scaling over temperature to be performed when producing the respective chip, whereas, when using a microcontroller for the scaling, calibration of the scaling over temperature can only be performed on system level.

Figure 3:
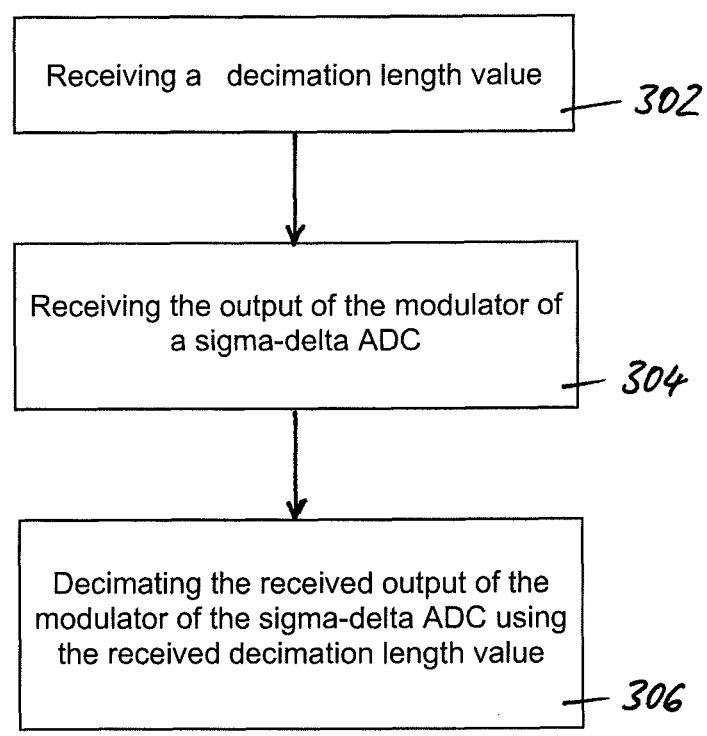
FIG. 3 shows an exemplary method according to an embodiment of the invention.

FIG. 3 shows an exemplary method according to an embodiment of the invention. The method for scaling an output of a modulator of a sigma-delta ADC is carried out by a decimation filter having an adjustable decimation length, wherein the method comprises the following steps of: receiving a decimation length value (step 302); receiving the output of the modulator of a sigma-delta ADC (step 304); decimating the received output of the modulator of the sigma-delta ADC using the received decimation length value (step 306).

Figure 4:
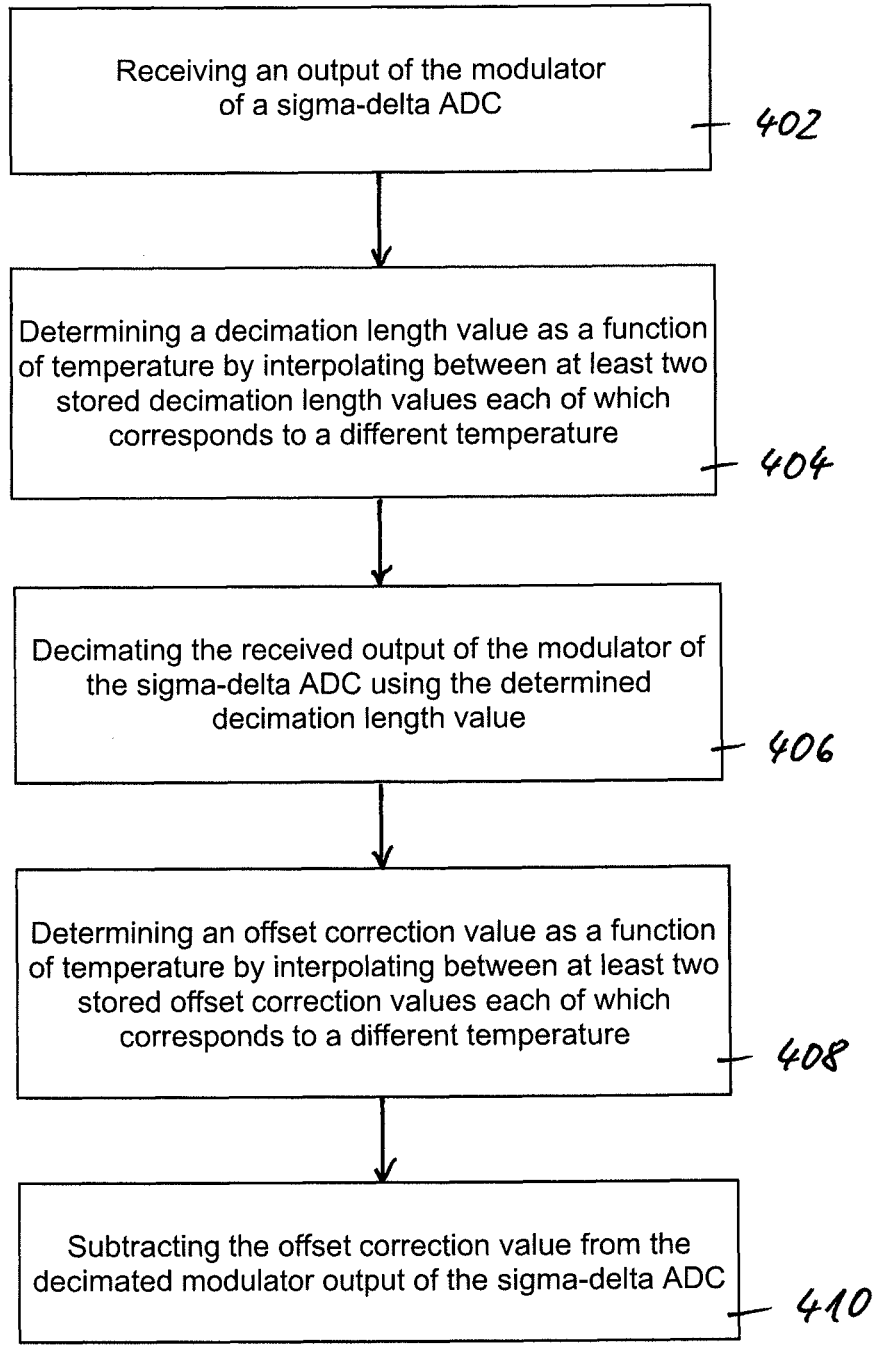
FIG. 4 shows an exemplary method according to a further embodiment of the invention.

FIG. 4 shows an exemplary method according to a further embodiment of the invention. The method for compensating temperature-dependent variations of a reference voltage in a sigma-delta ADC comprises the following steps of: receiving an output of a modulator of the sigma-delta ADC (step 402); determining a decimation length value as a function of temperature by interpolating between at least two stored decimation length values each of which corresponds to a different temperature (step 404); decimating the received output of the modulator of the sigma-delta ADC using the determined decimation length value (step 406); determining an offset correction value as a function of temperature by interpolating between at least two stored offset correction values each of which corresponds to a different temperature (step 408); and subtracting the offset correction value from the decimated modulator output of the sigma-delta ADC (step 410).

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A system for scaling an output of a modulator of a sigma-delta analog digital converter (ADC), the system comprising:

a decimation filter with a decimation length that is adjustable by a decimation length value received as an input to the decimation filter, wherein the decimation length value is proportional to a quotient of a length of an output range of the sigma-delta ADC and a length of a predetermined result range to which the output range of the sigma-delta ADC is scaled, and wherein the decimation filter is configured to receive the output of the modulator of the sigma-delta ADC and decimate the received output of the modulator of the sigma-delta ADC using the received decimation length value.

2. The system of claim 1, wherein the decimation length value corresponds to a product of a resolution of the predetermined result range and the quotient of the length of the output range of the sigma delta ADC and the length of the predetermined result range.

3. The system of claim 1, wherein an output range of the sigma delta ADC is defined by a reference voltage and the decimation length of the decimation filter is continuously adjusted to variations of the reference voltage by adjusting the decimation length value input to the decimation filter.

4. The system of claim 3, wherein the reference voltage is temperature-dependent and the decimation length value is continuously determined as a function of temperature.

5. The system of claim 4, further comprising a first interpolator configured to interpolate between at least two stored decimation length values that correspond to different temperatures to determine a decimation length value for an arbitrary temperature.

6. The system of claim 1, further comprising a subtracter configured to:

receive an offset correction value and the output of the decimation filter; and subtract the offset correction value from the received output of the decimation filter.

7. The system of claim 6, wherein an output range of the sigma delta ADC is defined by a reference voltage and the reference voltage is temperature-dependent and the offset correction value is continuously determined as a function of temperature.

8. The system of claim 7, further comprising a second interpolator configured to:

interpolate between at least two stored offset correction values which correspond to different temperatures to determine an offset correction value for an arbitrary temperature.

9. A method for scaling an output of a modulator of a sigma-delta analog digital converter (ADC), the method comprising:

receiving a decimation length value added a decimation filter that has an adjustable decimation links, wherein the decimation length value is proportional to a quotient of a length of an output range of the sigma-delta ADC and a length of a predetermined result range;

receiving the output of the modulator of the sigma-delta ADC at the decimation filter; and decimating, by the decimation filter, the received output of the modulator of the sigma-delta ADC using the received decimation length value.

10. The method of claim 9, wherein the decimation length value is determined such that an output range of the sigma delta ADC is scaled to a predetermined result range.

11. The method of claim 9 wherein the decimation length value corresponds to a product of a resolution of the predetermined result range and a quotient of the length of the output range of the sigma delta ADC and the length of the predetermined result range.

12. The method of claim 9, wherein an output range of the sigma delta ADC is defined by at least one reference voltage provided by at least one reference and the decimation length of the decimation filter is adjusted to variations of the reference voltage by adjusting the decimation length value input to the decimation filter.

13. The method of claim 12, wherein the reference voltage is temperature-dependent and the decimation length value is continuously determined as a function of temperature.

14. The method of claim 13, further comprising:
determining a first decimation length value corresponding to a first temperature;
determining a second decimation length value corresponding to a second temperature; and
determining a decimation length value corresponding to an arbitrary temperature by linear interpolating between the first decimation length value and the second decimation length value.

15. The method of claim 12, wherein the reference voltage is temperature-dependent and the method further comprises:
determining the decimation length value as a function of temperature by interpolating between at least two stored decimation length values each of which corresponds to a different temperature.

16. The method of claim 9, further comprising:
receiving an offset correction value; and
subtracting the offset correction value from the decimated modulator output of the sigma-delta ADC.

17. The method of claim 16, wherein an output range of the sigma delta ADC is defined by at least one reference voltage and the reference voltage is temperature-dependent and the offset correction value is continuously determined as a function of temperature.

18. The method of claim 17, further comprising:
determining a first offset correction value corresponding to a first temperature;
determining a second offset correction value corresponding to a second temperature; and
determining an offset correction value corresponding to an arbitrary temperature by linear interpolating between the first offset correction value and the second offset correction value.

19. The method of claim 16, wherein an output range of the sigma delta ADC is defined by at least one reference voltage and the reference voltage is temperature-dependent and the method further comprises:
determining the offset correction value as a function of temperature by interpolating between at least two stored offset correction values each of which corresponds to a different temperature.

20. A method for compensating temperature-dependent variations of a reference voltage in a sigma-delta analog digital converter (ADC), the method comprising:
receiving an output of a modulator of the sigma-delta ADC;
determining a decimation length value as a function of temperature by interpolating between a plurality of stored decimation length values, each stored decimation length value corresponding to a different temperature;
decimating the received output of the modulator of the sigma-delta ADC using the determined decimation length value;
determining an offset correction value as a function of temperature by interpolating between a plurality of stored offset correction values, each stored offset correction value corresponding to a different temperature; and
subtracting the offset correction value from the decimated modulator output of the sigma-delta ADC.

21. A system for compensating temperature-dependent variations of at least one reference voltage in a sigma-delta analog digital converter (ADC), the system comprising:
a first interpolator for determining a decimation length value as a function of temperature by interpolating between at least two stored decimation length values each of which corresponds to a different temperature; and
a decimation filter configured to receive an output of a modulator of the sigma-delta ADC and the decimation length value, and to decimate the received output of the modulator using the received decimation length value.

22. A system for compensating temperature-dependent variations of a reference voltage in a sigma-delta analog digital converter (ADC), the system comprising:
means for receiving an output of a modulator of the sigma-delta ADC;
means for determining a decimation length value as a function of temperature by interpolating between at least two stored decimation length values each of which corresponds to a different temperature;
means for decimating the received output of the modulator of the sigma-delta ADC using the determined decimation length value;
means for determining an offset correction value as a function of temperature by interpolating between at least two stored offset correction values each of which corresponds to a different temperature; and means for subtracting the offset correction value from the decimated modulator output of the sigma-delta ADC.

23. A system for scaling an output of a modulator of a sigma-delta analog digital converter (ADC), the system comprising:
a decimation filter with a decimation length that is adjustable by a decimation length value received as an input to the decimation filter,
wherein the decimation filter is configured to receive the output of the modulator of the sigma-delta ADC and decimate the received output of the modulator of the sigma-delta ADC using the received decimation length value, and an output range of the sigma-delta ADC is temperature dependent and the decimation length value is determined as a function of temperature.

* * * * *